United States Patent
Rennies et al.

(10) Patent No.: US 6,215,323 B1
(45) Date of Patent: Apr. 10, 2001

(54) METHOD AND APPARATUS FOR TEMPERATURE-CONTROLLED TESTING OF INTEGRATED CIRCUITS

(75) Inventors: Jos Rennies, Paal; Barts Noels, Ham, both of (BE)

(73) Assignee: Melexis N.V., Leper (BE)

( * ) Notice: Subject to any disclaimer, the term of this patent is extended or adjusted under 35 U.S.C. 154(b) by 0 days.

(21) Appl. No.: 09/322,246

(22) Filed: May 28, 1999

(51) Int. Cl.$^7$ .................................................. G01R 31/02
(52) U.S. Cl. ........................... 324/760; 324/758; 324/765
(58) Field of Search ..................... 324/760, 758, 324/765; 219/494; 62/3.3, 3.7

(56) References Cited

U.S. PATENT DOCUMENTS

| | | |
|---|---|---|
| 3,979,671 | 9/1976 | Meeker . |
| 3,986,337 | 10/1976 | Richard . |
| 4,089,184 | 5/1978 | Beitner . |
| 4,134,447 | 1/1979 | Frosch . |
| 4,172,993 | 10/1979 | Leach . |
| 4,253,515 | 3/1981 | Swiatosz . |
| 4,324,285 | 4/1982 | Henderson . |
| 4,402,185 | 9/1983 | Perchak . |
| 4,426,619 | 1/1984 | Demand . |
| 4,579,527 * | 4/1986 | Wedel et al. ................... 432/230 |
| 4,604,572 | 8/1986 | Horiuchi . |
| 4,607,220 | 8/1986 | Hollman . |
| 4,612,772 | 9/1986 | Jones . |
| 4,636,726 | 1/1987 | Santomango . |
| 4,727,720 | 3/1988 | Wernicki . |
| 4,734,872 | 3/1988 | Eager . |
| 4,759,190 | 7/1988 | Trachtenberg . |
| 4,780,086 | 10/1988 | Jenner . |
| 4,839,587 | 6/1989 | Flatley . |
| 5,006,796 | 4/1991 | Burton . |
| 5,028,988 | 7/1991 | Porter . |
| 5,184,068 * | 2/1993 | Twigg et al. ..................... 324/760 |
| 5,424,209 * | 6/1995 | Kearney ........................... 435/284 |
| 5,510,724 * | 4/1996 | Itoyama et al. .................. 324/760 |
| 5,767,489 * | 6/1998 | Ferrier ............................. 219/497 |
| 5,844,208 * | 12/1998 | Tustaniswkyj et al. .......... 219/494 |
| 5,903,163 * | 5/1999 | Tverdy et al. .................... 324/760 |
| 5,966,940 * | 10/1999 | Gower et al. ....................... 62/3.3 |
| 6,095,293 * | 5/2000 | Ghoshal ............................ 62/3.7 |

\* cited by examiner

*Primary Examiner*—Safet Metjahic
*Assistant Examiner*—T. R. Sundaram
(74) *Attorney, Agent, or Firm*—Townsend & Townsend & Crew LLP

(57) ABSTRACT

Method and apparatus for testing integrated circuits at controlled temperatures in a low thermal mass environment. The test system uses heat transfer elements such as Peltier devices inside the test head area to transfer thermal energy from one surface to another. The use of Peltier devices and the very low thermal mass of the combined test head and device under test (DUT), allow for fast and accurate temperature reduction of the DUT leads without using liquid Nitrogen. One embodiment of the test system is particulary suitable for low temperature testing of electronic devices that include magnetic sensitive elements such as Hall effect devices.

18 Claims, 4 Drawing Sheets

METHOD AND APPARATUS FOR TEMPERATURE-CONTROLLED TESTING OF INTEGRATED CIRCUITS

BACKGROUND OF THE INVENTION

The present invention relates in general to testing of integrated circuits, and in particular to method and apparatus for testing of integrated circuits at temperatures other than ambient temperature using Peltier type devices.

Integrated circuits (ICs) are typically designed to be fully operational within a specified range of temperatures. In some applications this range is wide enough to test the limits of the various technologies involved. The need to operate an IC at temperatures as low as −30° C. or −40 ° C., for example, often leads to additional complication and expense at the testing stage. Traditionally devices are pre-cooled and fed into a cold chamber surrounding the test head. The test chamber and test heads are maintained at the low temperature using liquid Nitrogen as a heat sink. This method suffers from a number of drawbacks. It requires plumbing low temperature liquid Nitrogen which needs careful controls because of the danger associated with liquid Nitrogen. This type of temperature control method also demands measuring the temperature of a large thermal mass which can be costlier and tends to compromise accuracy. Condensation, and in some instances ice formation, on the surfaces and test heads is also a source of potential problems whereby mechanical systems are disrupted, and electrical contacts are rendered high impedance or intermittent. To avoid inaccurate temperature control and unreliable test results additional provisions for controlling the atmosphere around the test device are required to reduce or eliminate condensation. Further, when an IC is brought into contact with the test head, care must be taken to limit the perturbation effect on the temperature of the low thermal mass IC caused by the temperature of the test head. These and other types of problems exist when the IC is to be tested at temperatures significantly higher than the ambient temperature. The high or low temperature testing can be made further complicated by the type of circuitry that is integrated on the IC. For example, certain ICs include magnetic sensitive devices (e.g., Hall-effect devices) that create additional problems associated with generating the magnetic fields using an electromagnet at the various temperatures.

There is therefore a need for a low mass test system with an accurate temperature control and a limited surface area for temperature testing.

SUMMARY OF THE INVENTION

The present invention provides method and apparatus for testing integrated circuits at low or high temperatures in a low thermal mass environment. Broadly, the invention uses heat transfer elements such as Peltier devices inside the test head area to transfer thermal energy from one surface to another. The use of Peltier devices and the very low thermal mass of the combined test head and device under test (DUT), allow for fast and accurate temperature control of the DUT leads without using liquid Nitrogen. In a specific embodiment, the present invention provides a test system with two or more temperature control chambers through which the DUTs are transported by an indexed conveyor belt. The DUT is first pre-cooled in a first chamber that is, for example, surrounded by pipes carrying a cooling liquid such as water at low temperature. The second chamber includes Peltier type devices that bring the temperature of the DUT to the target test temperature. The last chamber includes the test head probes that are also held at the test temperature by using Peltier type devices. Calibrated temperature sensors are embedded in the test head and probe assemblies to ensure accurate setting of the test temperature. The various chambers are preferably surrounded by an enclosure filled with, e.g., dried Nitrogen gas at room temperature and at slight positive pressure. This atmosphere eliminates condensation when performing low temperature testing, and allows the water pre-cool to go to a temperature below the normal dew point. The problems of condensation and the dangers of using liquid Nitrogen are thus eliminated by the method and apparatus of the present invention.

Accordingly, the present invention provides in one embodiment a low temperature testing system including a conveyor mechanism configured to carry a device to be tested; a first temperature control zone adapted to receive the device on the conveyor mechanism, and configured to bring the device to a first temperature; a second temperature control zone adjacent to the first temperature control zone and adapted to receive the device on the conveyor mechanism, the second temperature control zone including at least one Peltier type element as a heat exchanger to bring the device to a second temperature; and a test zone adjacent to the second temperature control zone, the test zone including a mechanical arrangement configured to receive the device to be tested and to hold the device to be tested in a known fixed position relative to a tester head, the test zone further including Peltier type elements attached to the mechanical arrangement to control the temperature of the test zone. To test devices having magnetic sensitive elements, the test zone of the testing system of the present invention further includes, in an alternative embodiment, magnetic field generating elements that are thermally isolated from the mechanical arrangement.

In another embodiment, the present invention provides a method for testing electronic devices at low temperatures including the steps of pre-cooling the integrated circuit to a first temperature in a first chamber; passing the integrated circuit into a second chamber; cooling the integrated circuit to a second temperature lower than the first temperature by the use of Peltier type elements inside the second chamber; passing the integrated circuit into a test chamber; cooling the test chamber to substantially the second temperature by the use of Peltier type elements; and bringing test head in contact to leads of the integrated circuit to carry out electrical testing of the integrated circuit.

The following detailed description along with the drawings provide a better understanding of the nature and advantages of the temperature testing methods and apparatus according to the present invention.

DESCRIPTION OF THE SPECIFIC EMBODIMENTS

Figure 1:
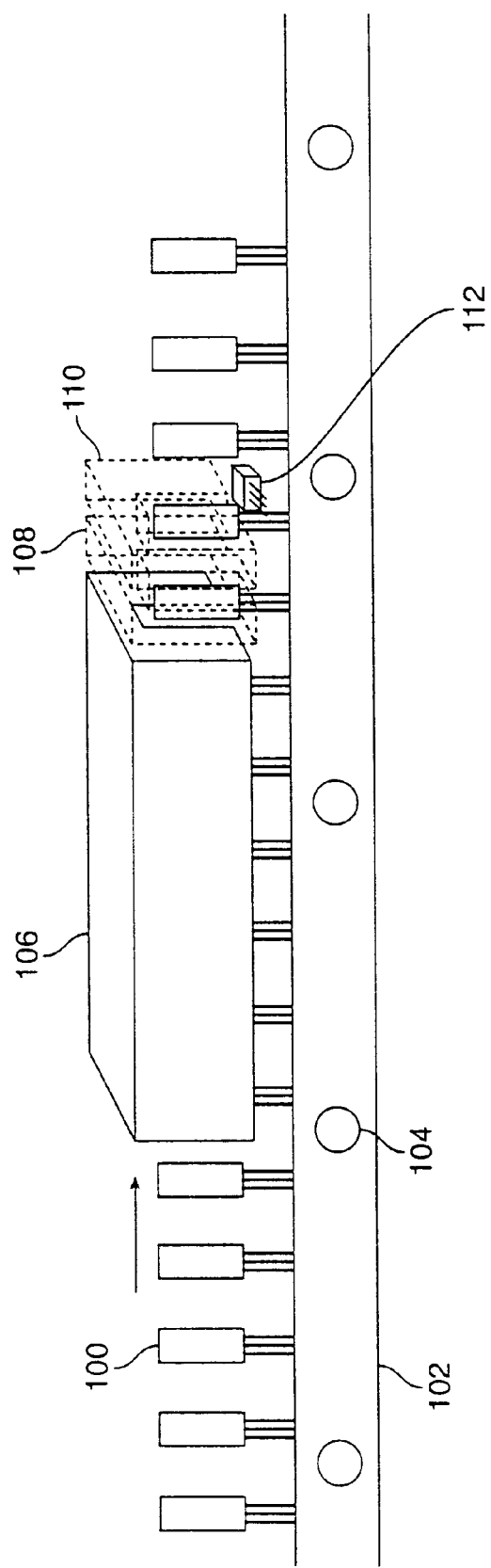
FIG. 1 is a simplified outline drawing of the temperature testing apparatus according to one embodiment of the present invention.

Referring to FIG. 1, there is shown an outline of the temperature testing apparatus according to a specific embodiment of the present invention. Multiple integrated circuit packages (or devices under test—DUTs) 100 are mounted onto a tape 102 such that they are held in a stable manner and their leads are accessible for probing for test purposes. Tape 102 preferably has multiple holes 104 or other suitable means for advancing the tape accurately to bring each successive DUT 100 to a known mechanical position. This allows DUTs 100 to be indexed forward and positioned in a test position so that contact can be made to the leads with precision. Tape 102 along with the attached DUTs 100 are passed through the tester.

For illustrative purposes only, the temperature control system of the present invention is described herein in the context of low temperature testing. It is to be understood, however, that similar advantages are provided by the testing system of the present invention for high temperature testing as well. Referring back to FIG. 1, DUTs 100 protruding from one side of tape 102 are initially passed through a first temperature control chamber 106 where their temperature is lowered to a first temperature. This first temperature control chamber 106 is held at its low temperature by, for example, passing cool water through pipes surrounding the chamber (not shown in FIG. 1). Each DUT 100 is then passed to a second temperature control chamber 108 that reduces the temperature of the individual DUT located within it to the final test temperature. Second temperature control chamber 108 preferably uses localized cooling elements such as Peltier type devices to extract heat and reduce temperature of each DUT 100. Peltier type devices operate such that when an electric current is passed through them the temperature of one surface of the Peltier device is rapidly lowered while the temperature of the opposite surface of the Peltier device is correspondingly raised. These types of devices can thus be used to either lower or raise the temperature of their environment, and provide a fast, efficient and accurate mechanism for localized temperature exchange. The terminology Peltier type device or Peltier device as used herein includes Peltier devices and other types of similar low mass heat transfer elements.

After second temperature control chamber 108, each DUT 100 is indexed to the final test chamber 110 and into the test head (not shown in FIG. 1). The test head is pre-cooled to the test temperature preferably using Peltier devices and contains within it a plurality of test probes 112. These test probes move towards DUT 100 and contact the leads of DUT 100 for electrical test purposes. The test probes and mechanical arrangement for controlling their position may also be pre-cooled using Peltier devices. The effect on the temperature of DUT 100 undergoing test by being brought into contact with the test head and the test probes is thus reduced or eliminated. This pre-cooling removes the need for overcooling the device to compensate for the thermal effects brought about by contact with a test head at a higher temperature than the target test temperature.

Figure 2:
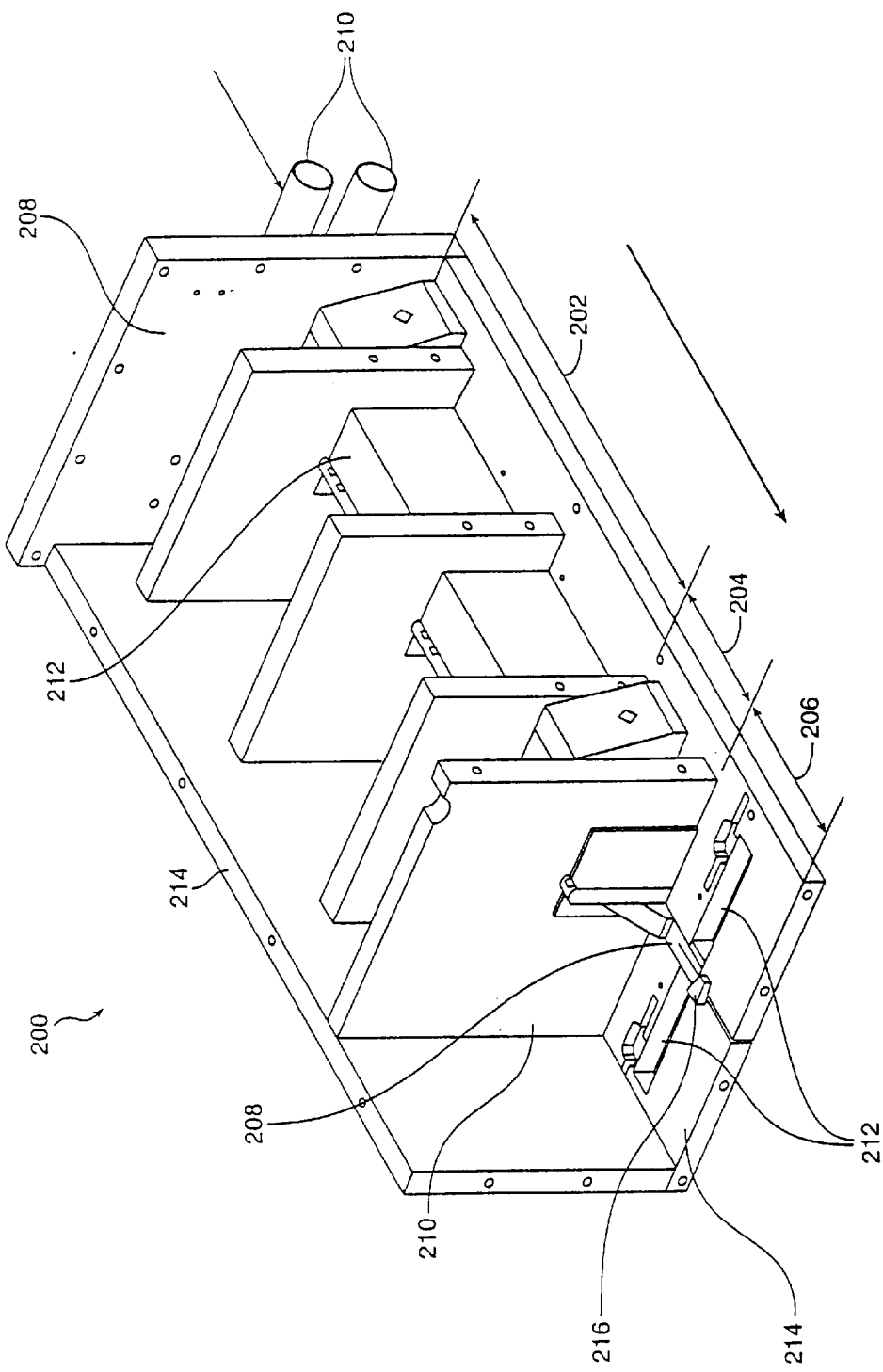
FIG. 2 shows an engineering isometric view of an exemplary enclosure for the temperature testing system of the present invention.

Referring to FIG. 2, there is shown a more detailed engineering isometric view of an exemplary enclosure 200 for the low temperature testing system of the present invention. The system includes three zones: a first pre-cooling zone 202, a second (final) cooling zone 204, and a test zone 206. First pre-cooling zone 202 includes first temperature control chamber (106 in FIG. 1), into which DUTs 100 first enter through input flange 208. The first pre-cooling zone 202 preferably includes a liquid heat sink (or water jacket) 212. In a preferred embodiment, pipes 210 carrying cool water and surrounding pre-cooling zone 202 reduce the temperature of zone 202 by forming a mechanical heat exchanger. Second cooling zone 204 includes second temperature control chamber (108 in FIG. 1), and operates to reduce the temperature of each DUT 100 to preferably the final test temperature before it is indexed into test zone 206. Low mass heat exchangers such as Peltier type devices are used inside second cooling zone 204 to bring the DUT temperature down to the desired level. The Peltier devices are mounted in intimate thermal contact with the inner surface of the chamber defining cooling zone 204 such as to remove heat from the chamber and thus to enable holding the temperature of the cooling zone at the desired level. As DUTs 100 pass through cooling zone 204, they lose heat to the cooling chamber and achieve the same desired temperature by the time they have transited the cooling zone.

As tape 102 indexes forward, DUTs 100 are carried out of second cooling zone 204 and enter test zone 206. The pre-cooled devices are already at the desired temperature, the desired temperature being the temperature at which the tests are to be carried out. Test zone 206 is also maintained at the desired temperature by using Peltier devices in a similar manner to second cooling zone 204. To increase cooling efficiency of the apparatus, the extracted heat is removed from test zone 206 by an extension 208 of wall 210 of second cooling chamber that extends into test zone 206. This heat exchange mechanism that includes part 208, extends across slots 212 in base plate 214 and may carry temperature or magnetic field sensors around location 216 so as to measure the exact conditions as close to the DUT as possible.

Figure 3:
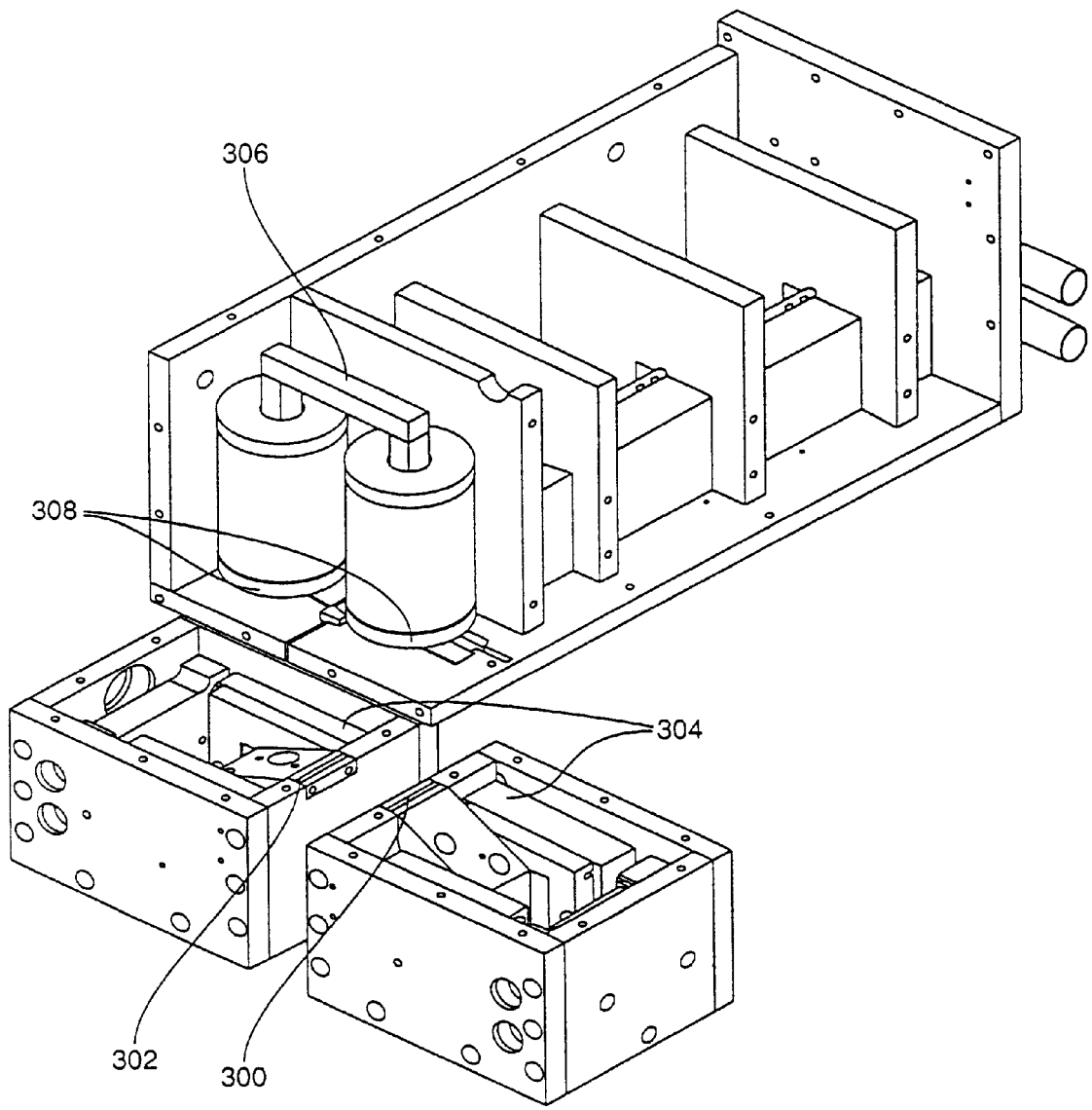
FIG. 3 shows another isometric view of the testing apparatus of the present invention illustrating more of the details for an alternative embodiment.

FIG. 3 shows the test zone assembly in greater detail for a particular embodiment that includes magnetic testing capability. In this embodiment, test zone 206 includes a test head assembly (shown partially outside of zone 206 for illustrative purposes) that is in two halves. One half includes a fixed part 300 and the other a moving part 302. Fixed part 300 of the test head forms a reference surface supporting the pins on the device being tested while moving part 302 moves such as to hold the pins against fixed part 300. This combination of indexing via tape 102 and fixed and moving parts 300 and 302 of the test head brings the pins of the device under test in known positions to make electrical contact. The test head and all its contacts are also brought to the desired temperature by the use of optimally located Peltier devices. In the embodiment shown in FIG. 3, shaped cooling elements 304 have embedded Peltier devices that provide for the heat transfer from the test head assembly.

For some applications, an integrated circuit may include magnetic sensitive devices such as Hall-effect devices. Low temperature testing of these types of ICs presents additional problems associated with generating the magnetic fields using an electromagnet within the cold zone. FIG. 3, depicts the use of electromagnet 306 placed within test zone 206 to facilitate low temperature testing of ICs with magnetic sensitive devices. The body of DUT 100 is positioned between poles 308 of electromagnet 306. In this embodiment, while DUT 100 is in the test head and contacts are being made to the pins of the device, a local magnetic field is adjusted under the control of the test computer system by varying the electric current in electromagnet 306. The magnetic field is preferably measured by a further field measurement means (shown in FIG. 4) embedded in or adjacent to the test head. Electromagnet 306 is thermally isolated from the test head to reduce or eliminate the heating effect of the current in each coil on the test head.

Figure 4:
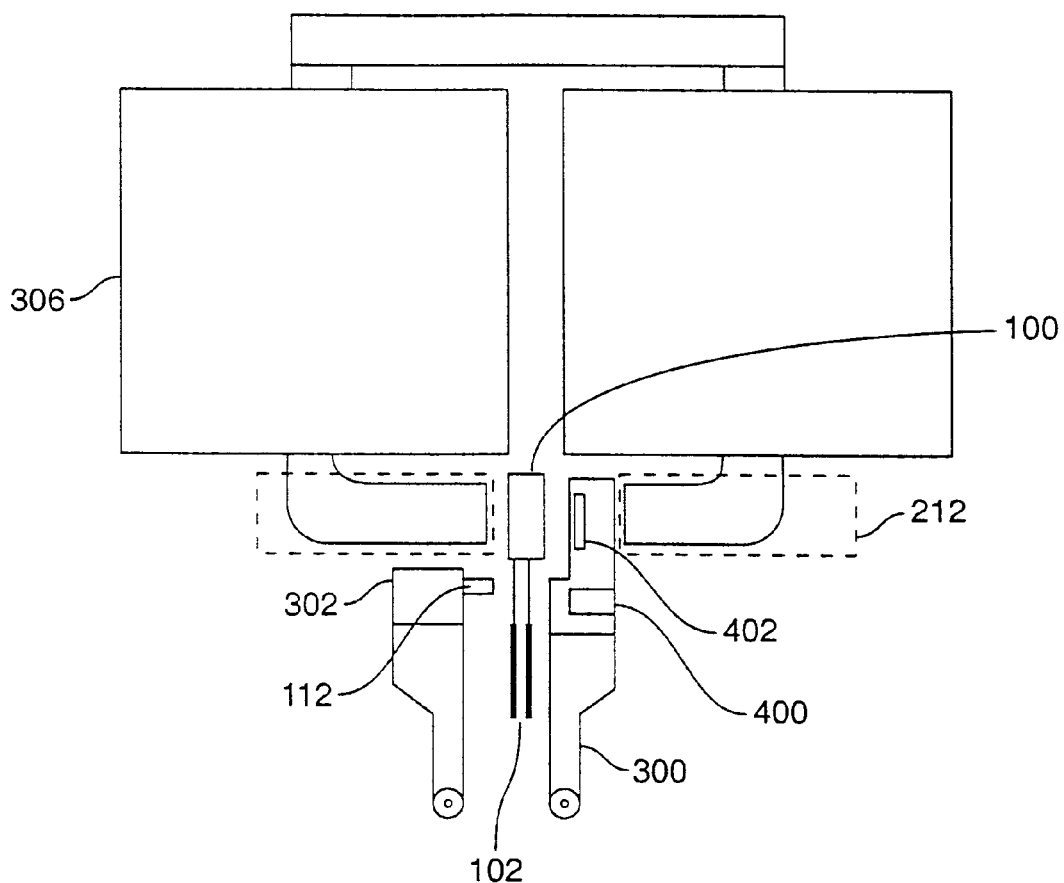
FIG. 4 shows details of one example of a test head arrangement according to the present invention.

FIG. 4 provides a more detailed view of the test head assembly. The same reference numerals are used herein to refer to the same components in the various figures. As shown in FIG. 3, DUT 100 is positioned between fixed part 300 and moving part 302 of the test head assembly. In the embodiment shown, electrical probes 112 are attached to moving half 302 of the test head assembly. When actuated, moving part 302 moves toward fixed part 300 such that probes 112 make electrical contact with the pins of DUT 100. The electrical contacts allow the device being tested to be powered and the desired electrical tests to be carried out. In a preferred embodiment, a temperature sensor 400 is embedded or attached to, for example, fixed part 300 as part of the temperature control system. For the purpose of measuring and controlling the magnetic fields during testing, a magnetic sensor 402 may be also be embedded or attached to, for example, fixed part 300 of the test head assembly.

By thus pre-cooling DUTs 100 to the desired temperature and maintaining the test head and the electrical contacts at the same desired temperature, the present invention ensures that the device being tested is at the target temperature. It also ensures that there is no temperature inaccuracy introduced by heat transfer from the contacts of the test head into the pins of the device being tested and thus into the device itself. The relatively fast heat transfer characteristic of the Peltier type devices also minimizes the delay in the test system while the temperature stabilizes. Thus, the system of the present invention speeds up testing as well as maintaining temperature accuracy and test integrity.

In a preferred embodiment, the entire arrangement of pre-coolers 202, 204 and the test head and electromagnet 306 in test zone 206 are contained within a further outer enclosure (walls 208 and 214 shown in FIG. 2). This enclosure is filled with a dry atmosphere, preferably nitrogen, at a pressure higher than atmospheric. This arrangement ensures that the test head and the DUTs within it are kept clean and dry such as to eliminate the risk of condensation and possible ice formation.

In conclusion, the present invention provides method and apparatus for testing integrated circuits at controlled temperatures in a low thermal mass environment. Broadly, the invention uses heat transfer elements such as Peltier devices inside the test head area to transfer thermal energy from one surface to another. The use of Peltier devices and the very low thermal mass of the combined test head and device under test (DUT), allow for fast and accurate temperature reduction of the DUT leads without using liquid Nitrogen. While the above is a complete description of specific embodiments of the present invention, it is possible to use various alternatives, modifications and equivalents. For example, Peltier type devices allow the temperature control chambers and test chamber of the present invention to be configured to elevate the temperature as opposed to reducing it for high temperature testing. Further, while the specific exemplary structure of the test system has been described as having three chambers, the system can be designed with only two or more than three depending on the application requirements. Therefore, the scope of the present invention should be determined not with reference to the above description but should, instead, be determined with reference to the appended claims, along with their full scope of equivalents.

What is claimed is:

1. A temperature-controlled testing system comprising:
   a conveyor mechanism configured to carry a device to be tested;
   a first temperature control zone adapted to receive the device on the conveyor mechanism, and configured to bring the device to a first temperature;
   a second temperature control zone adjacent to the first temperature control zone and adapted to receive the device on the conveyor mechanism, the second temperature control zone including at least one heat transfer element as a heat exchanger to bring the device to a second temperature; and
   a test zone adjacent to the second temperature control zone, the test zone including a test head arrangement configured to receive the device to be tested and to hold the device to be tested in a known fixed position relative to the test head arrangement, wherein the test head arrangement includes contact means configured to make electrical contact to a plurality of leads of the device to be tested, the test zone further including heat transfer elements attached to the test head arrangement which bring the temperature of the contact means to substantially the second temperature.

2. The temperature-controlled testing system of claim 1 wherein the at least one heat transfer element in the second zone and the heat transfer elements in the test zone each include a Peltier device.

3. The temperature-controlled testing system of claim 1, wherein the test head arrangement comprises a fixed part supporting the device to be tested and a moving part that brings the contact means in connection with the plurality of leads of the device to be tested.

4. The temperature-controlled testing system of claim 3 wherein a temperature sensor is attached to the test head arrangement.

5. The temperature-controlled testing system of claim 4 wherein the temperature sensor is attached to the fixed part of the test head arrangement.

6. The temperature-controlled testing system of claim 1 wherein the at least one heat transfer element in the second zone and the heat transfer elements in the test zone are configured to reduce the temperature of the device to be tested relative to ambient temperature.

7. The temperature-controlled testing system of claim 1 wherein the at least one heat transfer element in the second zone and the heat transfer elements in the test zone are configured to elevate the temperature of the device to be tested relative to ambient temperature.

8. The temperature-controlled testing system of claim 1 wherein the test zone further includes a magnetic field generating element that is thermally isolated from the test head arrangement.

9. The temperature-controlled testing system of claim 1 wherein the first temperature control zone comprises one or more heat exchanger means carrying temperature-controlled water to control the temperature of the device to be tested.

10. The temperature-controlled testing system of claim 1 wherein the test zone comprises dry gas held at a positive pressure relative to normal atmospheric pressure.

11. A method for low-temperature testing an integrated circuit, comprising the steps of:
   pre-cooling the integrated circuit to a first temperature in a first temperature-controlled zone;
   passing the integrated circuit into a second temperature controlled zone;
   cooling the integrated circuit to a second temperature lower than the first temperature using a first heat transfer element;
   passing the integrated circuit into a test zone;
   cooling contact elements of a test head assembly in the test zone to substantially the second temperature using a second heat transfer element coupled to the test head assembly; and
   contacting the contact elements to leads of the integrated circuit to carry out electrical testing of the integrated circuit.

12. The method of claim 11 wherein the step of pre-cooling to the first temperature is achieved by running cool water in one or more pipes around or inside the first temperature controlled zone.

13. The method of claim 11 further comprising a step of generating an electromagnetic field inside the test zone for testing of magnetic sensitive devices inside the integrated circuit.

14. A low-temperature testing system comprising:

a conveyor tape configured to mount devices to be tested thereon, and to movie forward in accurate incremental steps;

a pre-cooling zone adapted to receive the devices to be tested on the conveyor tape, wherein an environment of the pre-cooling zone is cooled by running cool water in one or more pipes to pre-cool the devices under test to a first temperature;

a cooling zone adapted to receive the devices to be tested on the conveyor tape, the cooling zone including one or more heat transfer elements to reduce the devices to be tested to a test temperature; and a test zone adapted to receive the devices to be tested on the conveyor tape, the test zone including heat transfer elements that reduce the temperature of a test head assembly to substantially the test temperature, and a magnetic field generating element that is thermally isolated from the test head assembly.

15. The low-temperature testing system of claim 14, wherein the pre-cooling zone, the cooling zone and the test zone are contained in two or more separate chambers.

16. The low-temperature testing system of claim 14, wherein the test zone further comprises a magnetic field sensor and a temperature sensor.

17. The system of claim 14, wherein each of the heat transfer elements includes a Peltier device.

18. The method of claim 11, wherein each of the first and second heat transfer elements includes a Peltier device.

* * * * *